US011515242B2

(12) United States Patent
Kisaki et al.

(10) Patent No.: US 11,515,242 B2
(45) Date of Patent: Nov. 29, 2022

(54) WIRING SUBSTRATE, ELECTRONIC DEVICE, AND ELECTRONIC MODULE EACH HAVING PLATE-SHAPED CONDUCTIVE PORTION IN FRAME PORTION OF INSULATION SUBSTRATE

(71) Applicant: KYOCERA Corporation, Kyoto (JP)

(72) Inventors: Takuo Kisaki, Kyoto (JP); Takahiro Sasaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 0 days.

(21) Appl. No.: 16/957,616

(22) PCT Filed: Dec. 27, 2018

(86) PCT No.: PCT/JP2018/048106
§ 371 (c)(1),
(2) Date: Jun. 24, 2020

(87) PCT Pub. No.: WO2019/131866
PCT Pub. Date: Jul. 4, 2019

(65) Prior Publication Data
US 2020/0335433 A1     Oct. 22, 2020

(30) Foreign Application Priority Data

Dec. 28, 2017 (JP) .............................. JP2017-253148
Jan. 31, 2018 (JP) .............................. JP2018-014673

(51) Int. Cl.
*H01L 23/498* (2006.01)
*H05K 1/02* (2006.01)
*H03H 9/10* (2006.01)

(52) U.S. Cl.
CPC ..... *H01L 23/49838* (2013.01); *H05K 1/0296* (2013.01)

(58) Field of Classification Search
CPC . H01L 23/49838; H05K 1/0296; H05K 1/183
See application file for complete search history.

(56) References Cited

U.S. PATENT DOCUMENTS

2006/0187614 A1* 8/2006 Ushio ................. H01M 50/128
361/502
2015/0208512 A1* 7/2015 Akita ..................... H05K 3/403
29/852

(Continued)

FOREIGN PATENT DOCUMENTS

JP    2000-312060 A    11/2000
JP    2009-111124 A    5/2009

(Continued)

*Primary Examiner* — Michael Jung
(74) *Attorney, Agent, or Firm* — Volpe Koenig

(57) ABSTRACT

To provide a wiring substrate, an electronic device, and an electronic module the size of which can be easily reduced and the strength of which can be maintained. A wiring substrate includes an insulation substrate and an electrical wiring structure. The insulation substrate includes a recess section in one surface. A frame portion of the insulation substrate that forms a side surface which connects an opened surface and a bottom surface of the recess section to each other includes a first conductive portion having a plate shape in the frame portion.

15 Claims, 4 Drawing Sheets

(56) References Cited

U.S. PATENT DOCUMENTS

| | | | |
|---|---|---|---|
| 2015/0305160 A1* | 10/2015 | Funahashi | H01L 21/4857 348/374 |
| 2016/0007447 A1* | 1/2016 | Funahashi | H05K 1/0306 348/375 |
| 2016/0105980 A1* | 4/2016 | Mori | H05K 5/0095 361/728 |
| 2016/0254302 A1* | 9/2016 | Ichiki | H01L 23/49822 257/433 |

FOREIGN PATENT DOCUMENTS

| | | |
|---|---|---|
| JP | 2010-098227 A | 4/2010 |
| JP | 2017-098400 A | 6/2017 |

\* cited by examiner

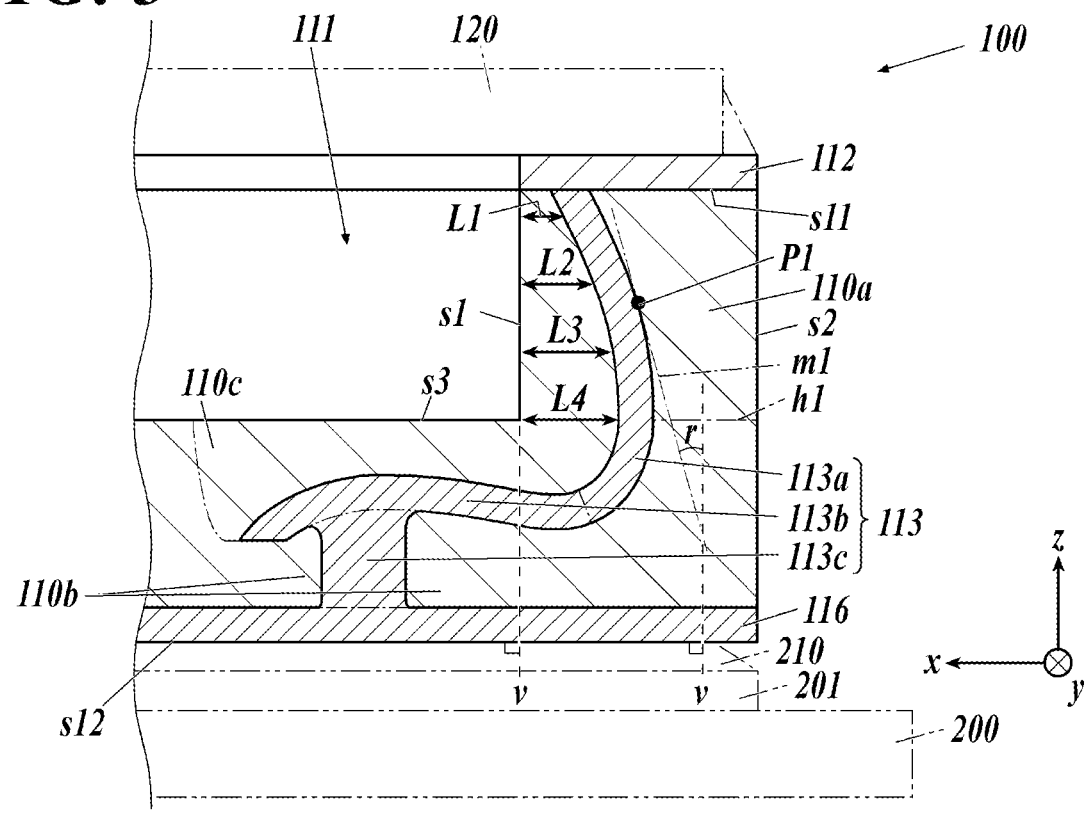
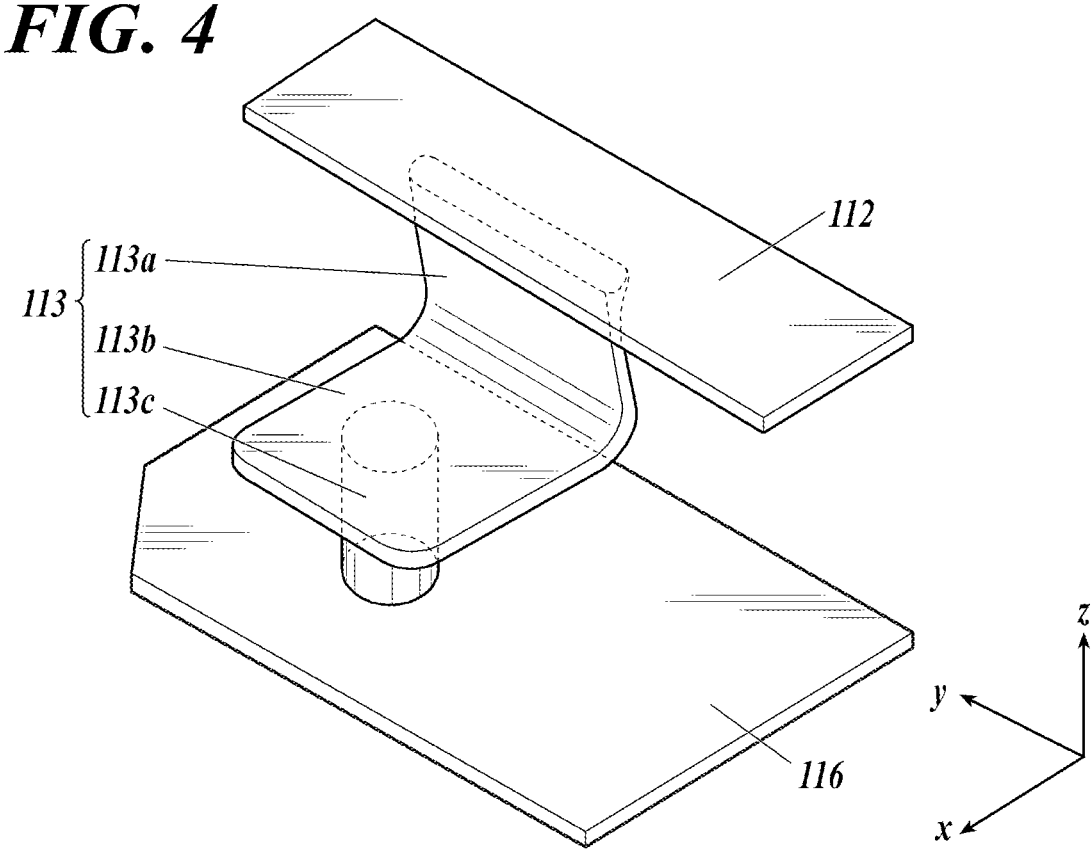

WIRING SUBSTRATE, ELECTRONIC DEVICE, AND ELECTRONIC MODULE EACH HAVING PLATE-SHAPED CONDUCTIVE PORTION IN FRAME PORTION OF INSULATION SUBSTRATE

TECHNICAL FIELD

The present disclosure relates to a wiring substrate, an electronic device, and an electronic module.

BACKGROUND ART

There is a package-shaped wiring substrate that accommodates an electronic component therein and allows the electronic component therein to be connected to external wiring so as to be mounted. If the electronic component is connected to an electronic device through the wiring substrate, handling, wiring, and connection of the electronic component are facilitated. If the electronic component is sealed with a lid, the electronic component is isolated from an external environment. Thus, the electronic component can be more stably operated.

A wiring substrate widely used as the above-described wiring substrate includes a recess section-shaped accommodation section to accommodate the electronic component. This wiring substrate is provided with a wiring conductor that penetrates from inside to outside of the accommodation section to electrically connect the electronic component in the accommodation section to the outside.

There also is a structure in which the lid or the like that seals the accommodation section is formed of a metal conductor, and the lid joined by using a through via disposed in a side wall of the accommodation section is connected to an electrode at a surface opposite the lid. With this structure, if a ground voltage is supplied to the electrode, influence of noise on the inside is reduced (see Japanese Unexamined Patent Application Publication No. 2000-312060 and 2009-111124).

SUMMARY OF INVENTION

A wiring substrate according to an aspect of the present disclosure includes an insulation substrate that comprises a recess section in a first surface and an electrical wiring structure.

A frame portion of the insulation substrate that forms a side surface which connects an opened surface and a bottom surface of the recess section to each other comprises a first conductive portion having a plate shape in the frame portion.

A wiring substrate according to another aspect of the present disclosure includes an insulation substrate that comprises a recess section in a first surface and an electrical wiring structure.

A frame portion of the insulation substrate that forms a side surface which connects an opened surface and a bottom surface of the recess section comprises a first conductive portion in the frame portion.

A distance between the first conductive portion and an inner side surface of the recess section is greater at a bottom surface height of the recess section than on a first surface side.

An electronic device according to an aspect of the present disclosure includes the above-described wiring substrate and an electronic component that is disposed in the recess section and that is connected to the electrical wiring structure.

An electronic module according to an aspect of the present disclosure includes the above-described electronic device and a module substrate to which the electronic device is connected.

BRIEF DESCRIPTION OF DRAWINGS

FIG. 3 is a sectional view including a wiring conductor.

FIG. 4 is a see-through perspective view of wiring from a frame-shaped metalized layer to an external connection conductor.

DESCRIPTION OF EMBODIMENTS

An embodiment according to the present disclosure is described below with reference to the drawings.

Figure 1A:
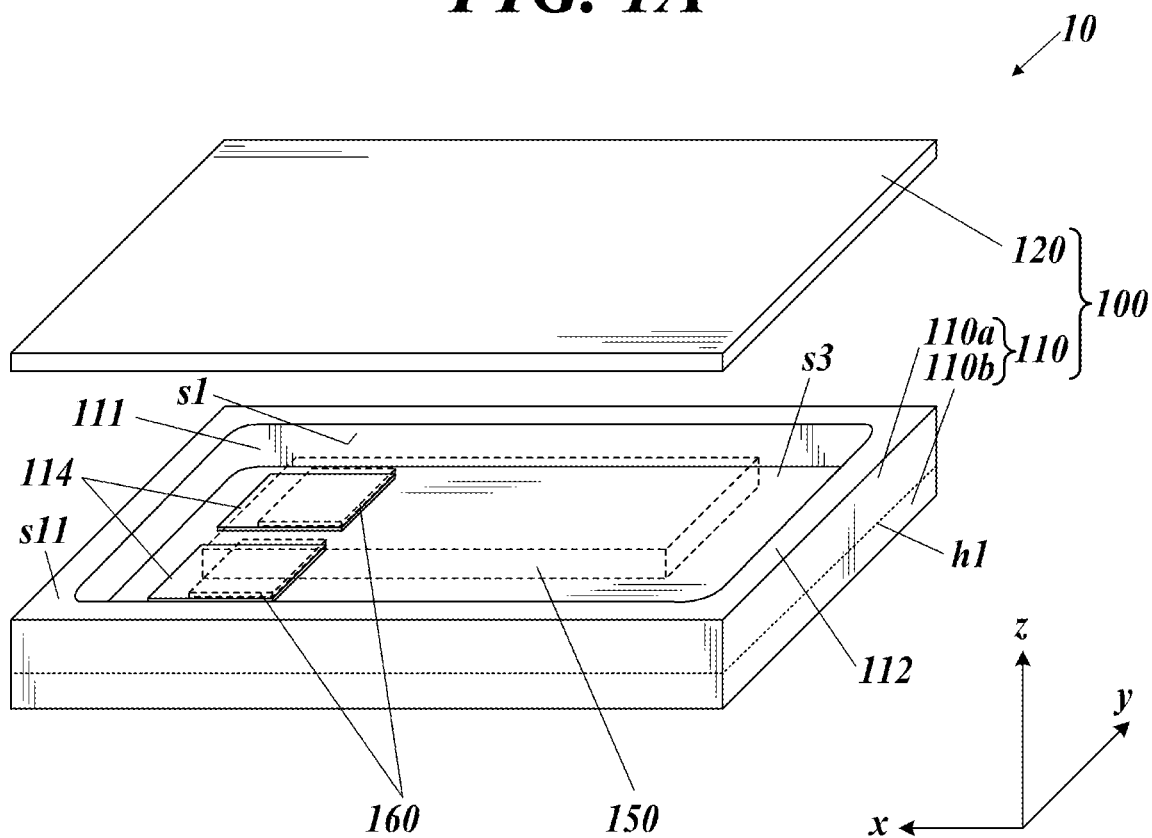
FIG. 1A is an overall perspective view of a wiring substrate with a lid removed.
Figure 1B:
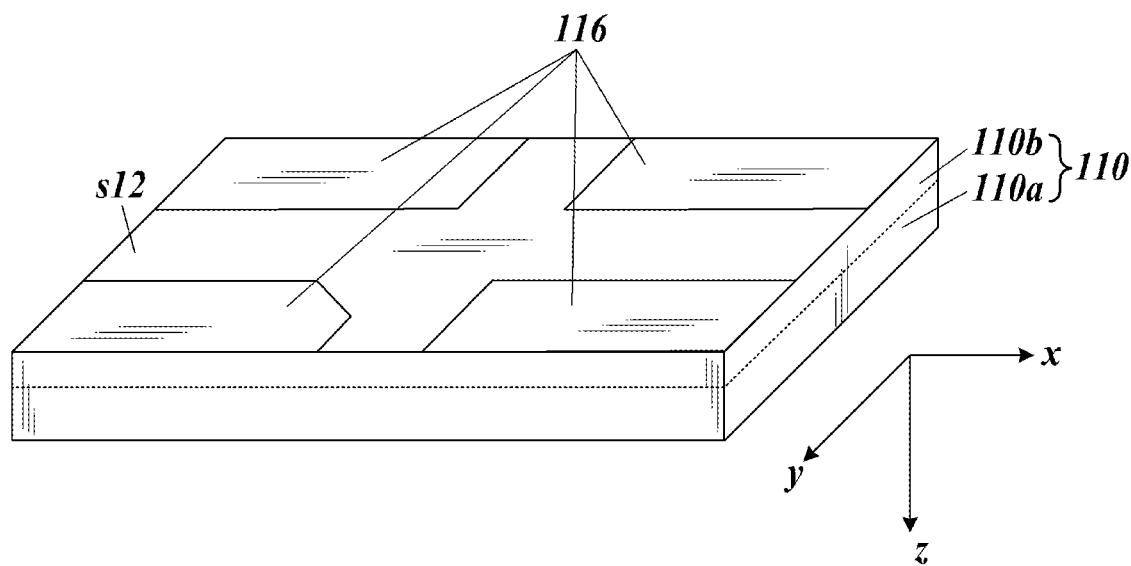
FIG. 1B is a perspective view of the wiring substrate seen from a bottom surface side.

FIGS. 1A and 1B are overall perspective views of a wiring substrate 100 of the present embodiment with a lid 120 removed. FIG. 1A illustrates a surface on a side where the lid 120 is to be joined, and FIG. 1B illustrates a surface opposite the side where the lid 120 is joined.

The wiring substrate 100 is an electronic component accommodation package that includes, for example, an insulation substrate 110, the lid 120, and a conductive portion including an electrical wiring structure. The insulation substrate 110 includes, for example, a frame portion 110a (side walls) and a base portion 110b. The insulation substrate 110 has an accommodation section 111 (recess section) that is a depressed region in a recessed shape in the surface where the lid 120 is to be joined (a sealing surface, that is, an upper surface in the z direction). The accommodation section 111 accommodates an electronic component 150. The frame portion 110a forms side surfaces (inner side surfaces s1) that surround the accommodation section 111 other than an opened surface superposed on the sealing surface and a surface opposite the opened surface (a placement surface for the electronic component 150). That is, the frame portion 110a forms surfaces connecting the opened surface and a placement surface s3 (bottom surface of the depressed region) to each other and separates the accommodation section 111 and an external environment from each other. Here, the inner side surfaces s1 are each parallel to the z direction. This ensures a large space between the opened surface and the placement surface s3 of the accommodation section 111. A frame-shaped metalized layer 112 (frame-shaped conductive layer) is disposed at a first surface s11 (end surface on the opened surface side) serving as a joining surface of the frame portion 110a with the lid 120. The frame-shaped metalized layer 112 is joined to the lid 120 with a sealing material such as a silver brazing alloy. Although it is not particularly limited, here, the size of the insulation substrate 110 is as follows: a side in an xy plane is about 0.8 to 10.0 mm and the thickness in the z direction is about 0.2 to 2.0 mm.

The base portion 110b forms the placement surface s3 (bottom surface) of the accommodation section 111 and a second surface s12 (bottom of substrate) that serves as a mounting surface for mounting on a module substrate 200. The base portion 110b has a plate-shaped form parallel to the xy plane. The base portion 110b includes a pair of connection pads 114 on the placement surface s3. External connection conductors 116 are disposed at the second surface s12 of the base portion 110b opposite the placement surface s3. The connection pads 114 have a surface shape and are electrically connected to the external connection conductors 116 through through conductors 115 that penetrate through the base portion 110b (see FIG. 2B).

The electronic component 150 is attached to the connection pads 114. For electrical connection between the electronic component 150 and the connection pads 114, a joining material 160 such as a conductive adhesive (for example, resin to which silver or other conductive particles are added) is used. If the joining material 160 is thermosetting, the joining material 160 is applied to the connection pads 114 in advance, and heat is applied with the electronic component 150 positioned relative to the connection pads 114 (joining material 160). Thus, the joining material 160 is cured, and the electronic component 150 is connected to the connection pads 114 through the joining material 160. The connection pads 114 are formed convexly from the placement surface s3 by, for example, screen printing (printing) or the like. Thus, the electronic component 150 is secured and separated from the placement surface s3 in the accommodation section 111. If the electronic component 150 generates, for example, vibration during operation, the thickness of the connection pads 114 and the joining material 160 can be determined such that the electronic component 150 is accommodated in the accommodation section 111 without being brought into contact with the placement surface s3 and the lid 120 during vibration.

Figure 2A:
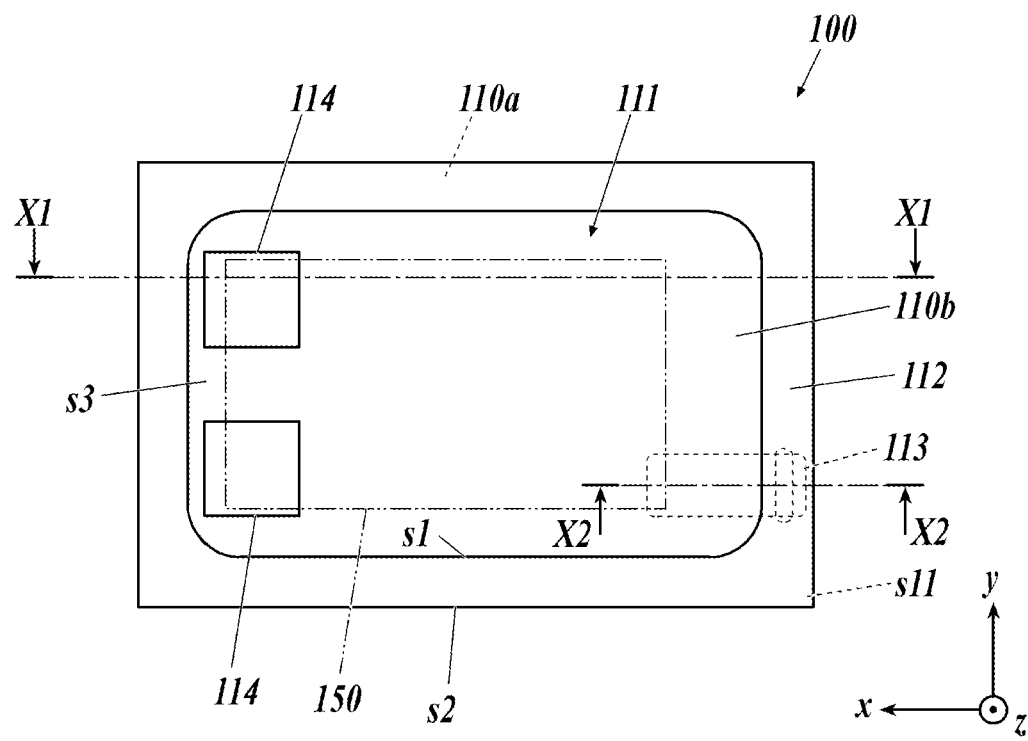
FIG. 2A is a plan view of the wiring substrate.
Figure 2B:
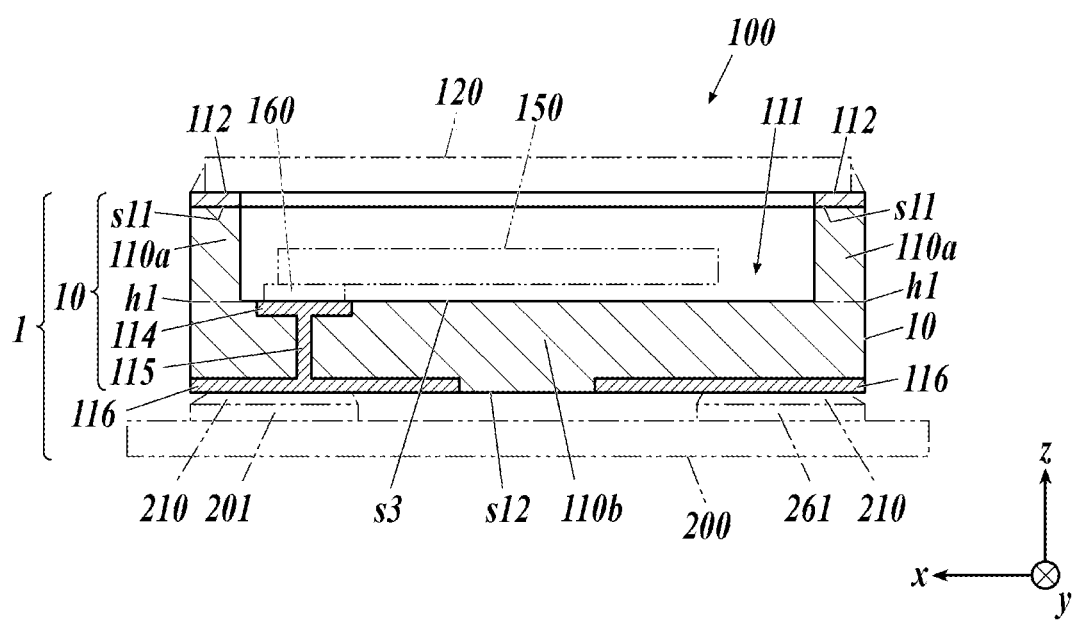
FIG. 2B is a sectional view of an electronic module.

The external connection conductors 116 are external electrodes to be joined to electrode pads 201 of the module substrate 200 (see FIG. 2B). An electronic device 10 that includes the wiring substrate 100 and the electronic component 150 accommodated in the wiring substrate 100 is included in an electronic module 1 (see FIG. 2B) together with the module substrate 200 (see FIG. 2B) to which the external connection conductors 116 are joined. Examples of the electronic component 150 include, but not limited to, for example, a crystal resonator, a surface acoustic wave element (SAW filter), or the like. Any one of a variety of electronic components such as a piezoelectric element, a capacitive element, a resistance element, an inductor for other purposes, another semiconductor element, and so forth may be used. A plurality of electronic components may be accommodated in a single accommodation section 111 according to need.

The insulation substrate 110 has insulation properties and is formed of a ceramic material, such as, for example, an aluminum oxide-based sintered body, an aluminum nitride-based sintered body, a mullite-based sintered body, or a glass-ceramic sintered body. Here, it is assumed that the insulation substrate 110 is formed of an aluminum oxide-based sintered body (alumina-based sintered body) for description. The frame portion 110a and the base portion 110b of the insulation substrate 110 are integrally formed such that the placement surface s3 is positioned at a bottom surface height h1 of the accommodation section 111.

The lid 120 is formed of conductive metal and is joined to the frame-shaped metalized layer 112, thereby hermetically sealing the accommodation section 111. For sealing, a conductive sealing member such as AuSn or a silver brazing alloy is used. The lid 120 is grounded so as to suppress propagation of external noise into the accommodation section 111. The lid 120 is connected to one of the external connection conductors 116 of the insulation substrate 110 through the conductive sealing member, the frame-shaped metalized layer 112, and a wiring conductor 113. If the external connection conductor 116 connected to the lid 120 is grounded, the lid 120 is grounded.

The frame-shaped metalized layer 112 is formed of conductive metal. The frame-shaped metalized layer 112 is formed on the first surface s11 of the frame portion 110a by, for example, printing.

Exposed surfaces of the frame-shaped metalized layer 112, the connection pads 114, the external connection conductors 116, and so forth may be coated with nickel-plated layers and/or gold-plated layers. For example, nickel-plated layers are provided on the exposed surfaces to a thickness of 1 to 20 μm, and a gold-plated layers are provided on these nickel-plated layers to a thickness of 0.1 to 3.0 μm. In this way, oxidation corrosion of the outer portions of the exposed surfaces is suppressed. With the plated layers, connection between the frame-shaped metalized layer 112 disposed on an upper surface of the insulation substrate 110 that is an insulation body and the lid 120 that is a metal conductor can be facilitated and strengthened.

Next, electrical wiring of the wiring substrate 100 is described.

FIG. 2A is a plan view of the wiring substrate 100. FIG. 2B is a sectional view of the electronic module 1 taken along line X1-X1 including the connection pads 114 and the electronic component 150 in FIG. 2A.

As illustrated in FIG. 2A, the wiring conductor 113, which will be described later, is disposed, so as to be superposed on the external connection conductor 116 to be grounded, in a region between one of the inner side surfaces s1 and one of the outer side surfaces s2 of the frame portion 110a and a partial region of the base portion 110b, for example, in a region from a position superposed on the frame portion 110a toward the placement surface s3 in plan view. The wiring conductor 113 is disposed close to the short side of a planar shape of the insulation substrate 110 in the frame portion 110a. The wiring conductor 113 is included in a conductive portion of the wiring substrate 100 of the present embodiment.

As illustrated in FIG. 2B, the electronic module 1 is made by joining the electronic device 10 to the electrode pads 201 of the module substrate 200 with joining members 210 such as solder interposed therebetween. In the electronic device 10 (electronic module 1), the connection pads 114 and the external connection conductors 116 are connected to each other through the through conductors 115 that penetrate through the base portion 110b. The electronic component 150 operates in accordance with a voltage and/or a current applied to the external connection conductors 116. The connection pads 114, the through conductors 115, and the external connection conductors 116 form the electrical wiring structure of the wiring substrate 100 of the present embodiment.

FIG. 3 is a sectional view taken along section line X2-X2 in FIG. 2A.

As described above, the wiring conductor 113 extends from the frame portion 110a to the base portion 110b in the insulation substrate 110. Here, in the wiring conductor 113, a first conductive portion 113a that extends from an upper portion of the frame portion 110a in the z direction and a second conductive portion 113b that extends in the base portion 110b in the x direction are integrally connected. A third conductive portion 113c is superposed on the external connection conductor 116 in plan view seen in the z direction and connected to the second conductive portion 113b.

The first conductive portion 113a penetrates through the inside of the frame portion 110a in the z direction without being exposed in the inner side surface s1 or the outer side surface s2 of the frame portion 110a. The first conductive portion 113a is connected to a rear side (contact surface side in contact with the frame portion 110a) of the frame-shaped metalized layer 112 on the first surface s11 side. The second conductive portion 113b is electrically connected to the external connection conductor 116 through the third conductive portion 113c. Thus, the lid 120 is electrically connected through the wiring conductor 113 not exposed in the surfaces of the insulation substrate 110 from the frame-shaped metalized layer 112 to the external connection conductor 116.

The accommodation section 111 sides of the first conductive portion 113a and the second conductive portion 113b are coated with a coating layer 110c. The coating layer 110c is formed of the same material as the material of the insulation substrate 110, that is, aluminum oxide-based ceramic paste here. In the wiring substrate 100, the coating layer 110c is integral and continuous as part of the insulation substrate 110.

Here, relative to a tangent m1 in contact with the first conductive portion 113a at an arbitrary point of contact P1, part of the first conductive portion 113a separated from the point of contact P1 in the z direction is curved in a direction separating from the tangent m1 toward the accommodation section 111. Regarding the distance between the first conductive portion 113a and the inner side surface s1 of the frame portion 110a, a distance L4 at the bottom surface height h1 of the accommodation section 111 is greater than distances L1 to L3 closer to the first surface s11 than the bottom surface height h1 in the z direction. The distances L1 to L4 gradually increase from the first surface s11 side toward the bottom surface height h1. Here, the first surface s11 side means a predetermined portion close to the first surface s11 out of a region from the bottom surface height h1 to the first surface s11. The first conductive portion 113a is inclined relative to a line v perpendicular to the second surface s12 at a degree of inclination r that is greater than a degree of inclination of the inner side surface s1. The form of the first conductive portion 113a as described above appears in a predetermined section, that is, a section that intersects the inner side surface s1, the first surface s11, and the second surface s12 and extends along the first conductive portion 113a.

The second conductive portion 113b is gently continuously connected to the first conductive portion 113a and extends in a direction parallel to the placement surface s3 of the accommodation section 111. A large surface of the second conductive portion 113b is not necessarily parallel to the placement surface s3. This large surface may be slightly inclined or may be undulated.

FIG. 4 is a see-through perspective view of wiring from the frame-shaped metalized layer 112 to the external connection conductor 116.

The first conductive portion 113a and the second conductive portion 113b have respective plate shapes and curved surface shapes in which large surfaces are curved. That is, the entirety of the first conductive portion 113a and the second conductive portion 113b has a curved surface shape in which the orientation of the entirety of the first conductive portion 113a and the second conductive portion 113b gradually changes. The large surfaces of the first conductive portion 113a and the second conductive portion 113b are respectively oriented along the inner side surface s1 and the placement surface s3. Here, the plate shape is not limited to a flat plate shape and may be a shape having a curved surface shape formed by being curved (belt shape or the like).

The first conductive portion 113a is connected to the frame-shaped metalized layer 112 in a range in which the first conductive portion 113a extends in the y direction. The second conductive portion 113b has an area sufficiently large for the third conductive portion 113c having a columnar shape. Accordingly, connection is reliably made in a large range from the frame-shaped metalized layer 112 to the external connection conductor 116. Since neither the first conductive portion 113a nor the second conductive portion 113b is exposed in the surfaces of the insulation substrate 110, an unintentional short circuit is not made. If the exposed surfaces are coated with plated layers, the conductors have higher wettability with the conductive sealing member used for sealing the lid 120 than that of the insulation substrate 110 formed of, for example, a ceramic material. Thus, since the conductors are not exposed, making of an unintentional short circuit or the like due to flowing of the conductive sealing member to an unintentional part and incomplete hermetical sealing due to lack of the conductive sealing member actually used for sealing are suppressed if the lid 120 is joined.

If a conductive plate is embedded in the insulation substrate 110 as described above, the strength of the insulation substrate 110 is improved. In particular, since the expansion coefficient of the insulation substrate 110 is different from those of the lid 120 and various types of wiring that are conductors, compared to the case where, for example, no metal conductor is disposed inside the frame portion 110a or a metal conductor is disposed inside but the conductor is a via or other structure having a thin columnar shape, the first conductive portion 113a reinforces the frame portion 110a if the temperature of the wiring substrate 100 is varied. In particular, since the wiring conductor 113 (first conductive portion 113a) is embedded such that the distance between the inner side surface s1 and the wiring conductor 113 increases at a boundary portion between the frame portion 110a and the base portion 110b (near the bottom surface height h1), cracking or the like at the boundary portion can be suppressed even if forces are exerted on the frame portion 110a in various directions. Such forces are generated in such a case where, for example, the lid 120 is connected to the insulation substrate 110.

Next, an example of a method of manufacturing the insulation substrate 110 that includes the wiring conductor 113 is described.

A through hole is provided in a ceramic green sheet that becomes the insulation substrate 110 and a conductor is injected so as to form the third conductive portion 113c. The external connection conductors 116 are formed on the second surface s12.

Metalized paste that becomes the first conductive portion 113a and the second conductive portion 113b is applied by printing (for example, screen printing) with a mask in an appropriate positional range including an upper portion of the third conductive portion 113c on the ceramic green sheet. Ceramic paste the material of which is the same as that of the ceramic green sheet is applied by printing (for example, screen printing) with a mask in appropriate positional ranges that cover part of the metalized paste.

The sheet to which the metalized paste and the ceramic paste are applied is pressurized with a pressurizing tool having an irregular shape corresponding to the accommodation section 111 and the frame portion 110a. This causes the metalized paste and the ceramic paste having been applied to be pressed down to the bottom surface height h1 of the accommodation section 111 and part of the metalized paste corresponding to the second conductive portion 113b to be interposed between the coating layer 110c and the ceramic green sheet and embedded. The ceramic green sheet, the metalized paste, and the ceramic paste are deformed and filled into a recess of the pressurizing tool, thereby the part corresponding to the first conductive portion 113a interposed between the coating layer 110c and the ceramic green sheet is embedded and formed.

In this way, the coating layer 110c and the ceramic green sheet are integrated with each other, thereby providing the insulation substrate 110 in which the metalized paste interposed between the coating layer 110c and the ceramic green sheet becomes the wiring conductor 113 not exposed other than in the first surface s11. The metalized paste applied by printing to have a planar shape becomes the first conductive portion 113a and the second conductive portion 113b that have curved surface shapes. Then, plating of the exposed surfaces, firing, attachment of the electronic component 150, joining of the lid 120, and so forth are performed according to need.

The electronic module 1 is manufactured by mounting the electronic device 10 on the module substrate 200. The external connection conductors 116 of the electronic device 10 are joined to the electrode pads 201 of the module substrate 200 by using the joining members 210.

[Variations]

Figure 5A:
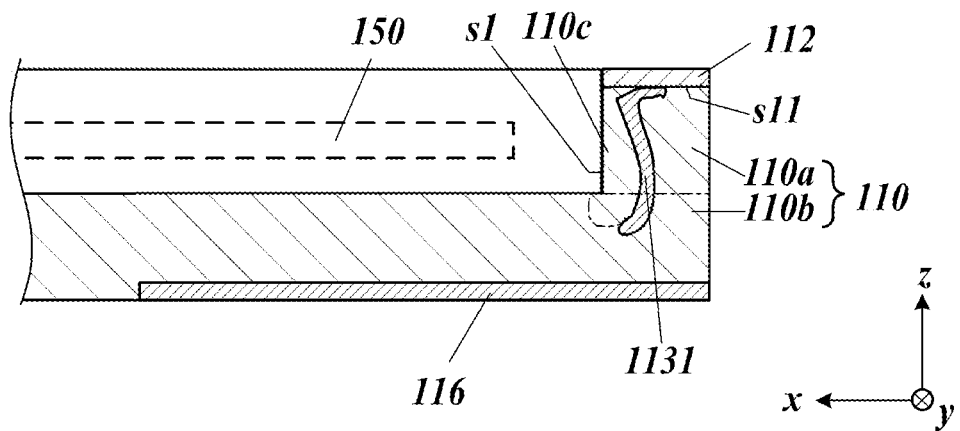
FIG. 5A is an explanatory view of a first variation of a first conductive portion.
Figure 5B:
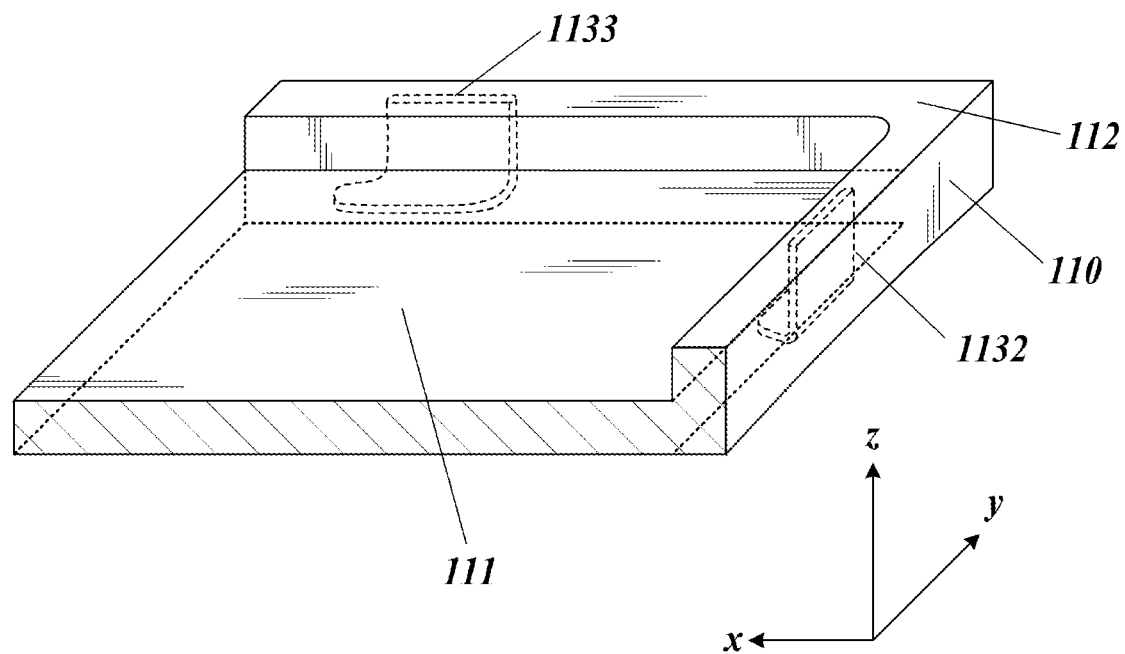
FIG. 5B is an explanatory view of a second variation of the first conductive portion.

FIGS. 5A and 5B illustrate variations of the wiring conductor. FIG. 5A is a sectional view illustrating an example of a first conductive portion 1131 of a first variation. FIG. 5B is a perspective view of part of the insulation substrate 110 including a portion where side conductors 1132, 1133 of a second variation are seen through the insulation substrate 110 drawn transparently.

The first conductive portion 1131 of the first variation illustrated in FIG. 5A is connected to, for example, either or neither of the second conductive portion 113b and the third conductive portion 113c. That is, although the first conductive portion 1131 is not electrically connected to the external connection conductor 116 and does not serve as part of the electrical circuit, the first conductive portion 1131 reinforces the frame portion 110a. In this case, the first conductive portion 1131 is not necessarily in contact with the frame-shaped metalized layer 112. Here, although neither the second conductive portion 113b nor the third conductive portion 113c exists in the illustration, the second conductive portion 113b and the third conductive portion 113c separated from the first conductive portion 1131 may be provided. In this case, the second conductive portion 113b and the third conductive portion 113c may be disposed at completely different positions, or the second conductive portion 113b may be disposed close to an extended end of the first conductive portion 1131 in the extension direction in the base portion 110b. Even if the second conductive portion 113b and the third conductive portion 113c are separately disposed, strength may be appropriately increased against stress in desired directions by aligning the axial directions of the disposed positions. Here, the first conductive portion 1131 is bent toward the outer side surface s2 of the frame portion 110a at a portion near a contact surface (near the first surface s11) where the first conductive portion 1131 and the frame-shaped metalized layer 112 are in contact with each other. In this case, the following distance may be adopted as the "distance from the inner side surface of the recess section on the first surface side to the wiring conductor": that is, the distance at a portion of the first conductive portion 1131 closest to the inner side surface in a range on the first surface s11 side relative to the central height of a range from the bottom surface height of the recess section to the first surface s11.

First conductive portions 1132, 1133 of the second variation illustrated in FIG. 5B are respectively disposed at two adjacent sides (the short side and the long side) of the frame portion 110a of the insulation substrate 110. That is, the insulation substrate 110 may include a plurality of the first conductive portions in the frame portion 110a. The positions (sides) of the plurality of first conductive portions are not particularly limited. The position where the wiring conductor 113 and the frame-shaped metalized layer 112 are connected to each other in the first surface s11 may be appropriately changed.

Neither the first conductive portion 1132 nor the first conductive portion 1133 has a curved surface shape in the frame portion 110a. The first conductive portions 1132, 1133 are parallel to the inner side surfaces s1 of the frame portion 110a forming the side surface of the accommodation section 111. It is possible that only one of the first conductive portions 1132, 1133 is connected to the frame-shaped metalized layer 112 and the external connection conductor 116 (through the second conductive portion 113b) or only one of the first conductive portions 1132, 1133 is not connected to the frame-shaped metalized layer 112 or the external connection conductor 116. Alternatively, it is possible that all the first conductive portions 1132, 1133 are connected to the frame-shaped metalized layer 112 and the external connection conductors 116 or neither the first conductive portion 1132 nor the first conductive portion 1133 is connected to the frame-shaped metalized layer 112 or the external connection conductor 116.

As described above, the wiring substrate 100 of the present embodiment includes the insulation substrate 110 including the recessed accommodation section 111 in the first surface s11 and the electrical wiring structure (the connection pads 114, the through conductors 115, the external connection conductors 116, and so forth). The frame portion 110a that forms the side surfaces connecting the opened surface and the bottom surface of the accommodation section 111 of the insulation substrate 110 includes the plate-shaped first conductive portion 113a therein.

If the conductive plate, that is, a metal plate or the like is disposed so as to be embedded in the frame portion 110a having a thin shape as described above, the frame portion 110a is reinforced, and accordingly, deformation or the like occurring in joining the lid 120 can be reduced during the manufacture. In particular, since the thermal expansion coefficient of the ceramic material of the frame portion 110a is different from that of the metal conductors and the like forming the wiring structure, if the metal conductors are included in the frame portion 110a formed of the ceramic material, such deformation can be effectively reduced. Since the first conductive portion 113a is not exposed, an unintentional short circuit is not made. Thus, the highly reliable wiring substrate 100 in which the electronic component 150 can be stably operated can be provided.

The first conductive portion 113a has a curved surface shape. Thus, the insulation substrate 110 (frame portion 110a) can be more effectively reinforced in a larger stress direction.

The distance between the first conductive portion 113a and the inner side surface s1 of the accommodation section 111 is greater at a position of the bottom surface height h1 of the accommodation section 111 than at a position on the first surface s11 side. Accordingly, the thickness of a root portion of the frame portion 110a from the inner side surface s1 to the first conductive portion 113a can be increased while separating the first conductive portion 113a from an angled portion on the outer peripheral side of the frame portion 110a. Accordingly, the possibility of cracking at the root portion of the frame portion 110a near the first conductive portion 113a can be further reduced even if forces are exerted on the frame portion 110a in various directions in, for example, joining the lid 120.

The first conductive portion 113a is curved relative to the arbitrary tangent m1 in the direction separating from the tangent m1 toward the accommodation section 111. Because of this form, the thickness between the first conductive portion 113a and the inner side surface s1 of the frame portion 110a can be increased at a portion near the bottom surface height h1 of the accommodation section 111. For example, in the case where the first conductive portion 113a is curved in the opposite direction, even if the thickness at the bottom surface height h1 of the accommodation section 111 is the same, the amount of reduction in thickness relative to the amount of change in position toward the first surface s11 increases. However, since the first conductive portion 113a is curved in the direction described for the above-described embodiment, the amount of reduction in thickness relative to the amount of change in position toward the first surface s11 can be reduced. Accordingly, if the first conductive portion 113a is curved as described above, the thickness between the first conductive portion 113a and the inner side surface s1 of the frame portion 110a can be increased at a portion near the root portion of the frame portion 110a. This can further reduce the possibility of cracking at portions near the root of the frame portion 110a.

According to the wiring substrate 100 of the present embodiment, the distance between the inner side surface s1 of the accommodation section 111 and the first conductive portion 113a gradually increases from the first surface s11 side toward a portion at the bottom surface height h1 of the accommodation section 111. Accordingly, if forces are exerted on the frame portion 110a in various directions, stress exerted on a portion near the first conductive portion 113a is spread and is not concentrated in a particular position. This can further reduce the possibility of cracking in the inner side surface s1 near the first conductive portion 113a throughout a range from the bottom surface height h1 of the accommodation section 111 to the first surface s11 side.

According to the wiring substrate 100 of the present embodiment, the degree of inclination r of the first conductive portion 113a with reference to the line v (normal line) perpendicular to the second surface s12 is greater than the degree of inclination of the inner side surface s1 of the accommodation section 111. Accordingly, in a structure in which the inner side surface s1 of the accommodation section 111 are nearly perpendicular to the second surface s12, the effects of reducing the possibility of cracking as described above are produced. In the structure in which the inner side surface s1 of the accommodation section 111 is nearly perpendicular to the second surface s12, it is ensured that the area of the accommodation section 111 from an opening end to the bottom surface is nearly uniform. This provides an advantage in that the electronic component 150 is easily mounted in the accommodation section 111.

According to the wiring substrate 100 of the present embodiment, the base portion 110b forming the bottom surface of the accommodation section 111 of the insulation substrate 110 includes the second conductive portion 113b therein. Thus, the base portion 110b can be similarly reinforced in addition to the frame portion 110a.

In the wiring substrate 100 of the present embodiment, the first conductive portion 113a and the second conductive portion 113b are connected to each other. That is, if the first conductive portion 113a and the second conductive portion 113b are integrally formed, the wiring substrate 100 can be effectively reinforced.

According to the wiring substrate 100 of the present embodiment, the insulation substrate 110 includes the external connection conductors 116 outside the accommodation section 111, and the second conductive portion 113b is electrically connected to one of the external connection conductors 116. Thus, the conductors themselves in the insulation substrate 110 can be used as wiring. The second conductive portion 113b is grounded if the external connection conductor 116 is grounded. This can effectively reduce influence of external noise on the electronic component 150 disposed inside. In particular, if the second conductive portion 113b and the first conductive portion 113a are connected to each other, external noise can be more effectively blocked. If the second conductive portion 113b also has a plate shape, the sectional area of the wiring conductor 113 is increased. Thus, electrical resistance of electrical circuitry including the case of grounding can be suppressed.

According to the wiring substrate 100 of the present embodiment, the first conductive portion 113a and the second conductive portion 113b are continuous with each other to have a curved surface shape. This reduces the likelihood of forces being exerted in a concentrated manner on a connecting portion between the first conductive portion 113a and the second conductive portion 113b. Thus, disconnection between the first conductive portion 113a and the second conductive portion 113b and cracking or the like in the insulation substrate 110 along with the disconnection can be avoided.

According to the wiring substrate 100 of the present embodiment, the frame-shaped metalized layer 112 disposed on the end surface on the opened surface side of the frame portion 110a is provided, and the first conductive portion 113a is electrically connected to the frame-shaped metalized layer 112 on the contact surface side of the frame-shaped metalized layer 112 in contact with the frame portion 110a. Thus, the first conductive portion 113a is electrically connected to the frame-shaped metalized layer 112 without being exposed at all. Accordingly, unnecessary short circuit can be avoided. This can prevent, in joining the lid 120 to the frame-shaped metalized layer 112, the occurrences of problems with insulation caused by extending of the conductive sealing member from the frame-shaped metalized layer 112 and flowing of the conductive sealing member along the conductors. A via hole provided in the frame portion 110a of related-art for connecting the frame-shaped metalized layer 112 to the external connection conductor 116 is not necessary. This drops need for a technique, time, and effort relating to improvement of positional accuracy for forming a through hole in the thin frame portion 110a. This can effectively reduce, for example, the likelihood of deformation due to lack of strength caused by formation of the via hole.

The electronic device 10 of the present embodiment includes the above-described wiring substrate 100 and the electronic component 150 that is disposed in the accommodation section 111 and connected to, for example, the electrical wiring structure (the connection pads 114, the through conductors 115, the external connection conductors 116, and so forth). The strength of such an electronic device 10 can be improved while the size of the electronic device 10 can be effectively accurately reduced in accordance with the size of the electronic component 150. If the first conductive portion 113a is also grounded, immunity against external noise can be effectively improved even if the frame portion 110a has a small thickness.

The electronic module 1 of the present embodiment includes the above-described electronic device 10 and the module substrate 200 to which the electronic device 10 is connected. If such an electronic device 10 is used, the electronic component and circuits can be more efficiently disposed on the module substrate 200. Accordingly, the size and weight of the electronic module 1 can be reduced and the functions of the electronic module 1 can be improved.

The above-described embodiment is exemplary, and various changes can be made to the embodiment.

For example, the length of the first conductive portion 113a in a direction along the peripheral direction of the frame portion 110a is smaller than the length of the frame portion 110a in the above description. However, this length of the first conductive portion 113a may be close to the length of the frame portion 110a.

The shape of the accommodation section 111 is not necessarily a cuboid. The shape of the accommodation section 111 in plan view may be a polygon other than a quadrangle or a quadrilateral other than a cuboid. The side surfaces of the accommodation section 111 formed by the frame portion 110a, the bottom surface of the accommodation section 111 formed by the base portion 110b, or both the side surfaces and the bottom surface of the accommodation section 111 may be curved instead of being flat. The side surfaces may have a tapered shape or have a step disposed partway.

The numbers, disposition, and positional relationships of the connection pads 114, the external connection conductors 116, and wiring lines connecting these may be appropriately changed in accordance with the electronic component 150 accommodated in the accommodation section 111. Also, the shape of the connection pads 114 may be changed.

According to the above-described embodiment, the description has been made with the example in which the insulation substrate 110 includes a single accommodation section 111 in a single surface. However, a plurality of accommodation sections may be provided in a single surface. The accommodation sections may be disposed in a plurality of (such as, for example, front and rear surfaces) surfaces (a plurality of first surfaces).

According to the above-described embodiment, it has been described that the wiring substrate 100 and the lid 120 have cuboid shapes. However, the wiring substrate 100 and the lid 120 may have other shapes than the cuboid shapes. For the cuboid, vertices, edges, or the like may be provided with notches.

Although the lid 120 is included in the wiring substrate 100 in the description of the above-described embodiment, the lid 120 may be a different unit from the wiring substrate 100.

Although the first conductive portion 113a and the second conductive portion 113b have respective plate shapes according to the above-described embodiment, only the first conductive portion 113a may have a plate shape. The base portion 110b, which has a sufficient area compared to the frame portion 110a, is not necessarily a plate-shaped conductor to obtain sufficient strength. That is, the second conductive portion 113b may have a thick linear structure. If the second conductive portion 113b is not provided, the first conductive portion 113a may extend downward so as to be connected to the external connection conductor 116.

If the first conductive portion 113a has such a shape that the distance between the first conductive portion 113a and the inner side surface s1 of the accommodation section 111 is greater at a position of the bottom surface height h1 of the accommodation section 111 than at a position on the first surface s11 side, the first conductive portion 113a may have a thick linear structure instead of a plate shape. Only with the above-described shape, cracking at a portion near the root of the frame portion 110a can be suppressed and the strength of the structure can be improved compared to the related-art structure.

According to the above-described embodiment, the structure is described in which the distance between the first conductive portion 113a of the wiring conductor 113 and the inner side surface s1 of the frame portion 110a gradually increases from the first surface s11 toward the bottom surface height h1 of the accommodation section 111 and the first conductive portion 113a of the wiring conductor 113 is curved. As the second variation, the structure is described in which the first conductive portion 113a is perpendicular to the second surface s12. However, the distance between the wiring conductor 113 and the inner side surface s1 of the frame portion 110a may be increased in a single step or a plurality of steps, and the first conductive portion 113a is not necessarily curved.

Formation of the first conductive portion 113a is not limited to the above-described method of manufacturing. The first conductive portion 113a may be formed by any method. If the first conductive portion 113a is manufactured by any of a variety of method of manufacturing, the first conductive portion 113a does not necessarily have a curved surface shape. In addition, the first conductive portion 113a and the second conductive portion 113b are not continuous with each other in a curved surface shape.

In addition to the above description, the specific structures described for the above-described embodiment and the specific details such as shapes, disposition, and positional relationships of the specific structures can be appropriately changed without departing from the gist of the present disclosure.

The invention claimed is:

1. A wiring substrate comprising:
an insulation substrate that comprises a recess section in a first surface, a frame portion that forms a side surface which connects an opened surface of the recess section and a bottom surface of the recess section to each other, and a base portion that forms the bottom surface;
an electrical wiring structure that is on and inside the base portion,
wherein the frame portion comprises a first conductive portion having a plate shape in the frame portion, and extending from the first surface to the base portion through the frame portion; and
an external connection conductor that is disposed outside the recess section and extends to an outer edge of the frame portion in plan view.

2. The wiring substrate according to claim 1, wherein the first conductive portion has a curved surface shape.

3. The wiring substrate according to claim 1, wherein a distance between the first conductive portion and an inner side surface of the recess section is greater at a bottom surface height of the recess section than on a first surface side.

4. The wiring substrate according to claim 3, wherein the first conductive portion is curved, relative to a tangent that is arbitrarily selected, in a direction separating from the tangent toward the recess section.

5. The wiring substrate according to claim 3, wherein the distance between the first conductive portion and the inner side surface of the recess section gradually increases from the first surface side toward a portion at the bottom surface height of the recess section.

6. The wiring substrate according to claim 3, wherein a degree of inclination of the first conductive portion and a line perpendicular to a second surface opposite the first surface of the insulation substrate relative to each other is greater than a degree of inclination of the inner side surface of the recess section and a line perpendicular to the second surface relative to each other.

7. The wiring substrate according to claim 1, wherein the base portion comprises a second conductive portion in the base portion.

8. The wiring substrate according to claim 7, wherein the first conductive portion and the second conductive portion are connected to each other.

9. The wiring substrate according to claim 8, wherein the first conductive portion and the second conductive portion are continuous with each other and form a curved surface.

10. The wiring substrate according to claim 9, further comprising:
a frame-shaped conductive layer disposed on an end surface on the opened surface side of the frame portion, wherein
the first conductive portion is electrically connected to the frame-shaped conductive layer on a contact surface side of the frame-shaped conductive layer in contact with the frame portion.

11. The wiring substrate according to claim 7, wherein the insulation substrate comprises an external connection conductor disposed outside the recess section, and wherein
the second conductive portion is electrically connected to the external connection conductor.

12. The wiring substrate according to claim 1, wherein the first conductive portion is curved, relative to a tangent that is arbitrarily selected, in a direction separating from the tangent toward the recess section.

13. The wiring substrate according to claim 1, wherein the first conductive portion is coated with an insulation body.

14. An electronic device comprising:
the wiring substrate according to claim 1; and
an electronic component that is disposed in the recess section and that is connected to the electrical wiring structure.

15. An electronic module comprising:
the electronic device according to claim 14; and
a module substrate to which the electronic device is connected.

* * * * *